United States Patent [19]

Fujibayashi

[11] Patent Number: 4,494,158

[45] Date of Patent: Jan. 15, 1985

[54] MUTING APPARATUS

[75] Inventor: Kenji Fujibayashi, Tokyo, Japan

[73] Assignee: Olympus Optical Co., Ltd., Tokyo, Japan

[21] Appl. No.: 353,885

[22] Filed: Mar. 2, 1982

[30] Foreign Application Priority Data

Mar. 10, 1981 [JP] Japan .................................. 56-34297

[51] Int. Cl.³ ............................................ G11B 15/18
[52] U.S. Cl. ..................... 360/69; 360/74.1; 369/53
[58] Field of Search ............... 381/93, 110; 360/74.1, 360/71, 69; 369/53, 56, 58; 242/186

[56] References Cited

U.S. PATENT DOCUMENTS 3,518,375 6/1970 Hawkins .............................. 381/110
4,232,348 11/1980 Satoh et al. ........................ 360/74.1

Primary Examiner—George G. Stellar
Attorney, Agent, or Firm—Frishauf, Holtz, Goodman and Woodward

[57] ABSTRACT

A tape recorder capable of sounding an alarm which indicates the end of run of a tape, includes a tape recorder control circuit which sends a first signal for effecting tape end muting and for sounding an end alarm. The first signal is supplied to a speaker through a power amplifier. The alarm issued from the speaker is sensed by a microphone and later acoustically fed back to the power amplifier through a microphone amplifier. The microphone amplifier has its gain substantially reduced to zero upon generation of the first signal. Even though an audible alarm is sounded, howling which may otherwise arise from the acoustic feedback of the alarm sound, is suppressed.

6 Claims, 11 Drawing Figures

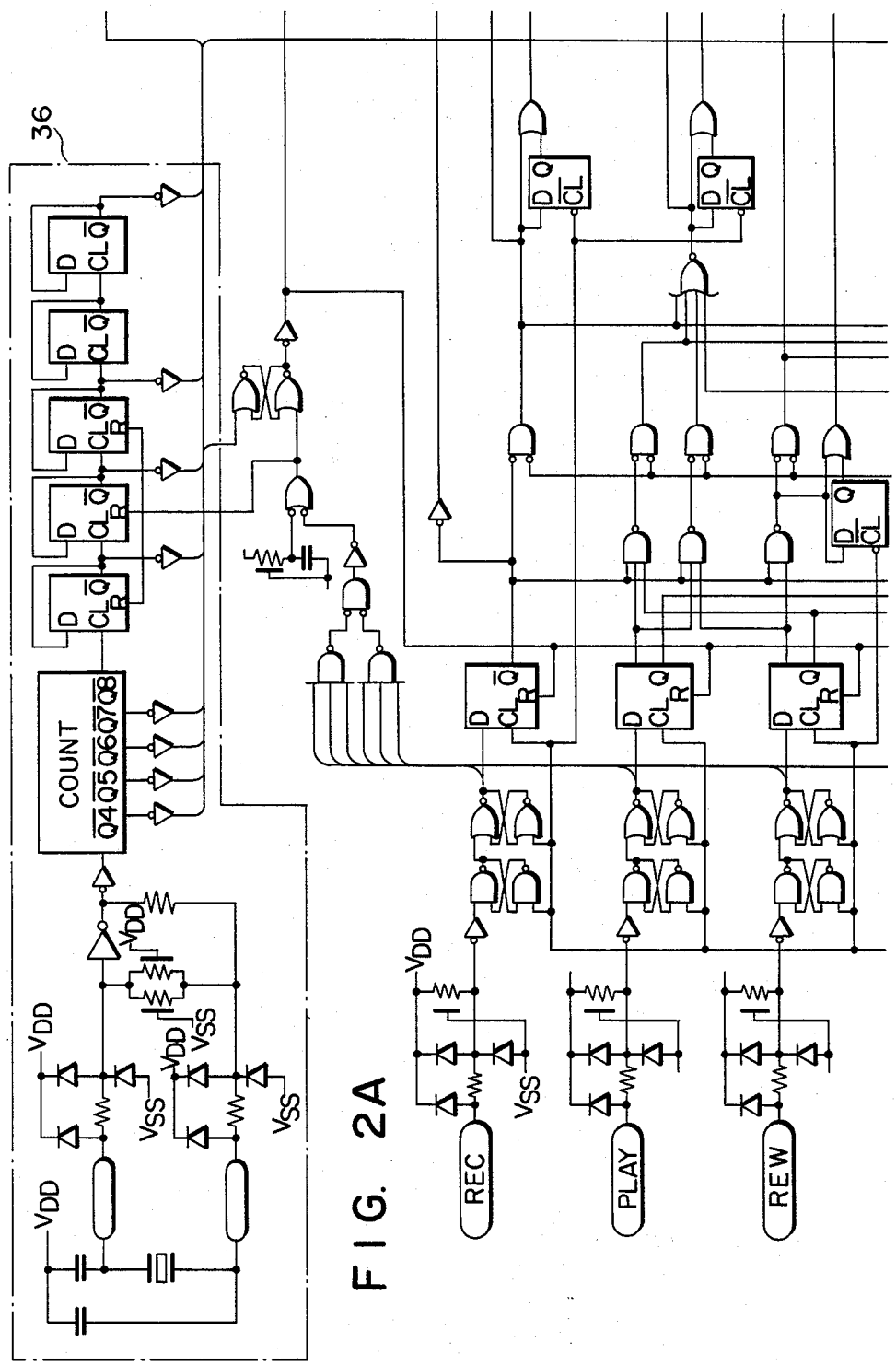
F I G. 2A

MUTING APPARATUS

BACKGROUND OF THE INVENTION

This invention relates to a muting apparatus used with an acoustic instrument such as a tape recorder.

With a tape recorder arranged for carrying out microphone recording, a power amplifier is generally subjected to a certain degree of muting during the recording mode. The reason is that if the power amplifier is actuated during the microphone recording, then howling undesirably arises, unless the sound volume is suppressed. Such howling tends to take place in a portable tape recorder in which a microphone and a speaker are mounted in the same cabinet. Further, the recent commercially available tape recorders are often required to have a tape end alarm-sounding function. This is because such alarm can inform the user that the run of a magnetic tape has been brought to an end during recording, even though no watch is kept on the remaining supply of the magnetic tape.

When, with a tape recorder having the aforementioned recording-muting function and tape end alarm-sounding function, a tape end is detected during recording, then it is necessary to release the recording muting and apply muting to the microphone amplifier. Unless a power amplifier is actuated by the release of recording muting, no alarm is sounded from a speaker. If, however, the microphone is actuated during the release of recording muting, then an alarm sound is positively fed back from the speaker to the microphone, giving rise to howling all the same. To prevent howling, therefore, muting is applied to the microphone amplifier almost at the same time as when the recording muting is released.

FIG. 1 shows the arrangement of a tape recorder having the aforesaid recording-muting function and tape end alarm-sounding function. An operation key 10 is connected to a tape recorder control circuit 12. When a recording mode is designated by the operation of the key 10, then the tape recorder control circuit 12 is set for the recording mode. At this time, the tape recorder control circuit 12 issues a signal commanding a constant speed tape run to a tape transport 14. At the issue of said command, the tape recorder control circuit 12 actuates a recording amplifier 16 including a bias circuit (not shown) by means of a recording mode signal E16. At the same time, the tape recorder control circuit 12 supplies a recording-muting signal Er to a power amplifier 18. As a result, the power amplifier 18 is rendered inactive, preventing any sound from being produced from a speaker 20. Input terminals of the recording amplifier 16 and the power amplifier 18 are connected to a signal mixer 22. The signal mixer 22 receives a voice signal E24 which is picked up by a microphone 26 and amplified through a preamplifier (microphone amplifier) 24.

When the run of a recording tape 28 by the tape transport 14 is brought to an end, then the rotation of a takeup reel 30 stops. The takeup reel 30 is coupled to a rotation sensor 32 which issues a pulse signal E32 corresponding to the rotation of the takeup reel 30. The pulse signal E32 is supplied to a tape end detector 34. When the interval of respective pulses constituting the signal E32 is extended over a prescribed value by the stop of the takeup reel 30, then the detector 34 issues the tape end signal E34, which in turn is delivered to the control circuit 12. The control circuit 12 is supplied with an alarm signal E36a issued from an oscillator 36. Upon receipt of the tape end signal E34, the control circuit 12 sends an end alarm signal Ea corresponding to the alarm signal E36a. The end alarm signal Ea represents an audible sound having a frequency of hundreds of Hz or several kHz, and is supplied to the signal mixer 22.

The control circuit 12 generates the end alarm signal Ea and also supplies a tape end muting signal Ee to the preamplifier 24, rendering the preamplifier 24 inactive. That is, when a tape end is detected during the microphone recording, then the power amplifier 18 is released from the recording muting. Instead, muting is applied to the preamplifier 24, and the end alarm signal Ea is supplied to the mixer 22. As a result, the speaker 20 sends a tape end alarm sound corresponding to the end alarm signal Ea. Since, at this time, the preamplifier 24 is rendered inactive, the acoustic feedback loop (positive feedback loop) is not formed which includes the speaker 20 and microphone 26. Therefore, when an end alarm is sounded, no howling is produced.

To attain the above-mentioned muting function, the tape recorder control system 38 and audio amplifiers 18, 24 should be connected via the three kinds of signals Er, Ee, Ea. When, however, it is attempted to produce said three signals Er, Ee, Ea when additionally, the control system is constructed, for example, by a one-chip IC package, then various difficulties sometimes arise. Now let it be assumed that the control system 38 is converted into the IC form, for example, by a dual inline type mold package, and further that when the signals Er, Ee, Ea are not provided, said IC package is received in a 22-pin type package. If, in this case, the IC package is additionally provided with terminals for handling said signals Er, Ee, Ea, then the IC package should be made into a 26-pin type, because external pins are increasingly provided each time by 2 units. When the IC package is changed from the 22 pin type to the 26-pin type, then the problem arises that the IC package is increased in cost, and difficulties are presented in loading of the electric system of a tape recorder reduced in size.

SUMMARY OF THE INVENTION

An object of the present invention is to overcome the aforementioned disadvantages and is intended to provide a muting apparatus for an acoustic instrument having an alarm-sounding function, which enables a muting signal and alarm signal to be handled by a single line.

To attain the above-mentioned object, this invention provides a muting apparatus which applies muting in a timing in which an alarm signal is used, thereby enabling both the alarm signal and muting signal to be transmitted by a single line. Therefore, a muting apparatus embodying this invention has the advantages that when the circuitry for generating the alarm signal and muting signal is integrated, the external pins of an IC package can be reduced in number. Since a single signal is to carry out two functions (muting and alarm functions) simultaneously, peripheral circuit parts can be decreased in number; and an instrument with which a muting apparatus embodying this invention is used, for example, a portable microcassette tape recorder, can be reduced in size and cost.

BRIEF DESCRIPTION OF THE DRAWING

FIGS. 2A to 2D show the circuit arrangement of a control logic 12 shown in FIG. 2;

DETAILED DESCRIPTION OF THE PREFERRED EMBODIMENTS

Figure 1:
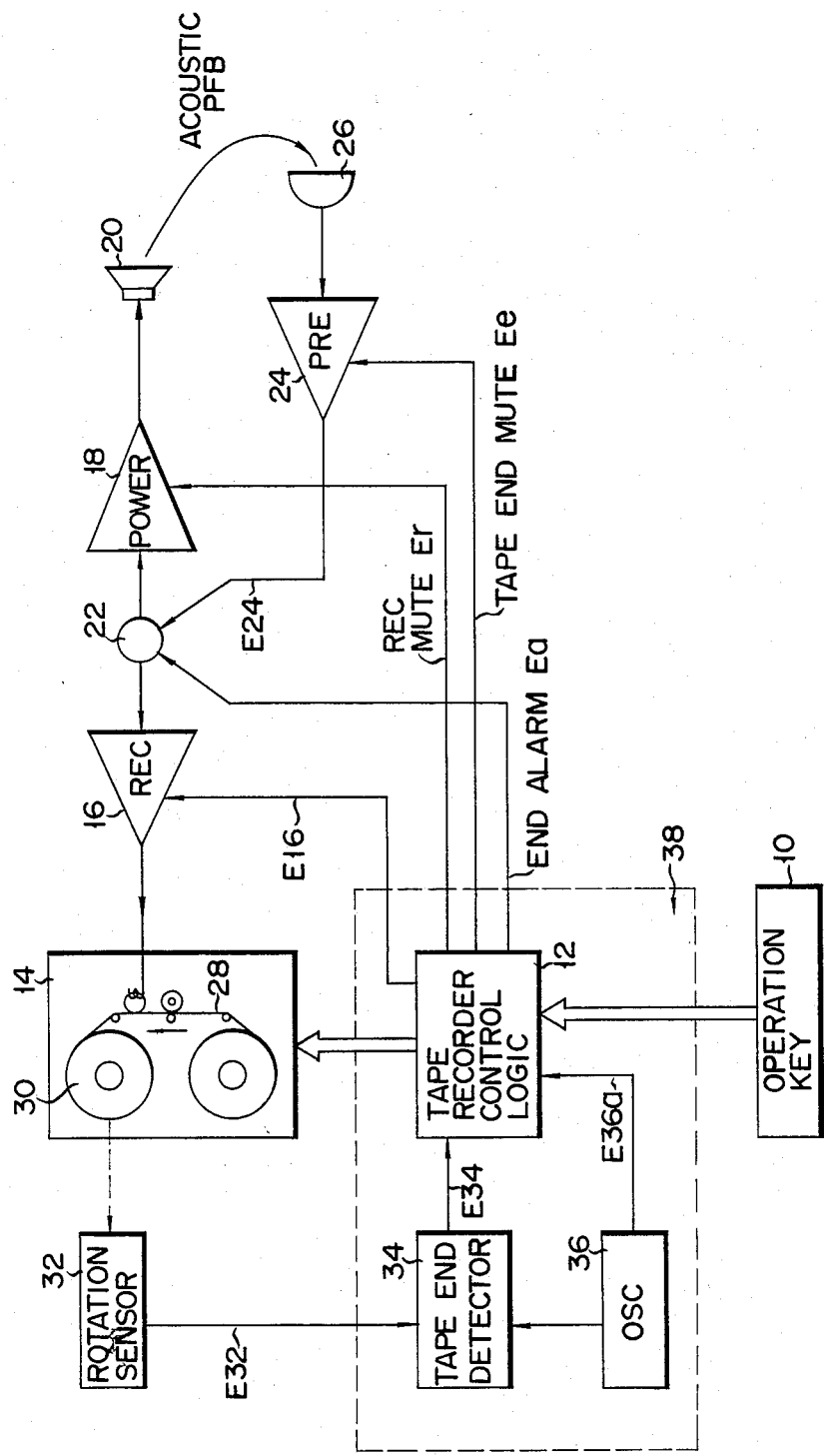
FIG. 1 shows the conventional arrangement of a tape recorder arranged for carrying out recording muting and tape end muting, and sounding an end alarm.

Description is now given with reference to the accompanying drawing of a muting apparatus embodying this invention. To avoid duplication of description, similar parts are denoted by the same or similar reference numerals throughout the drawing.

Figure 2:
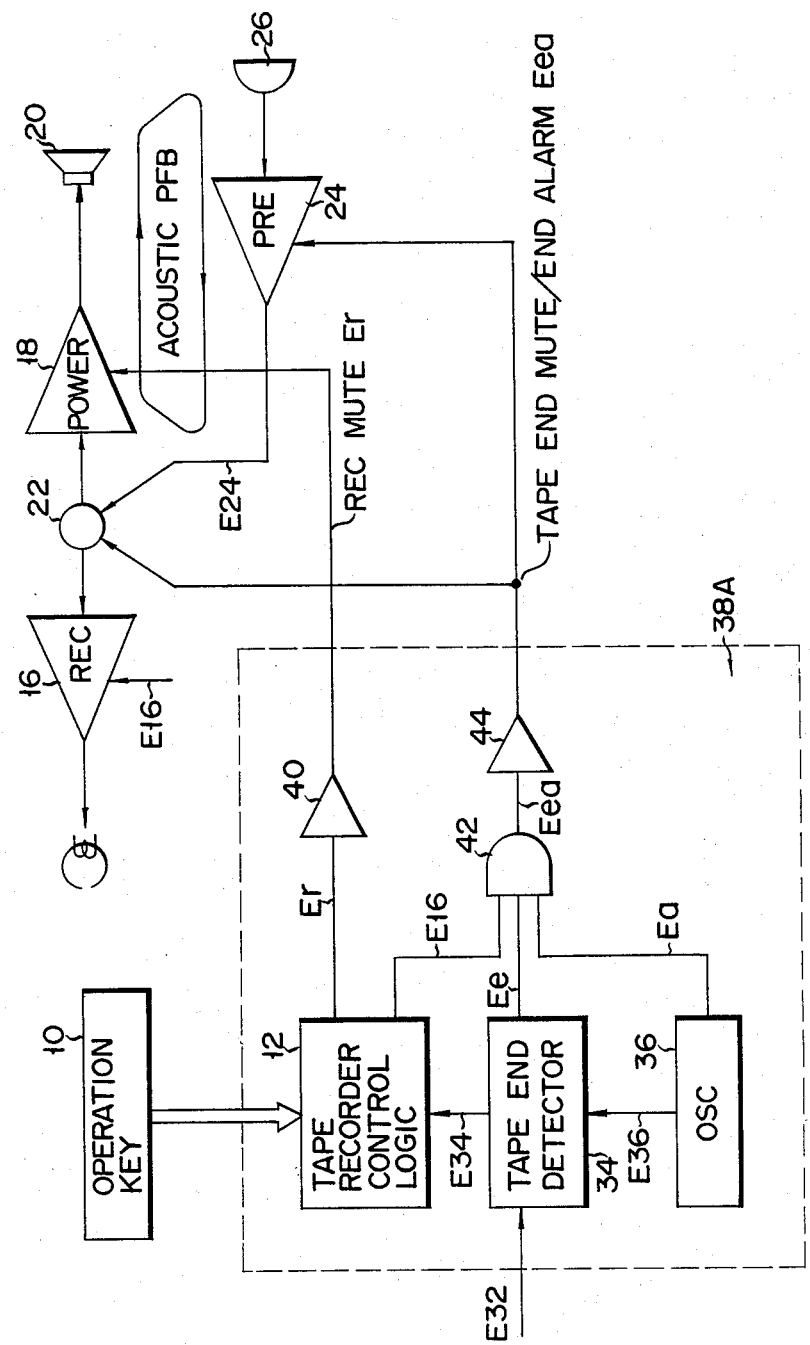
FIG. 2 indicates a muting apparatus embodying this invention, which is used with a tape recorder having the same arrangement and function as those of the tape recorder of FIG. 1.
Figure 2B:
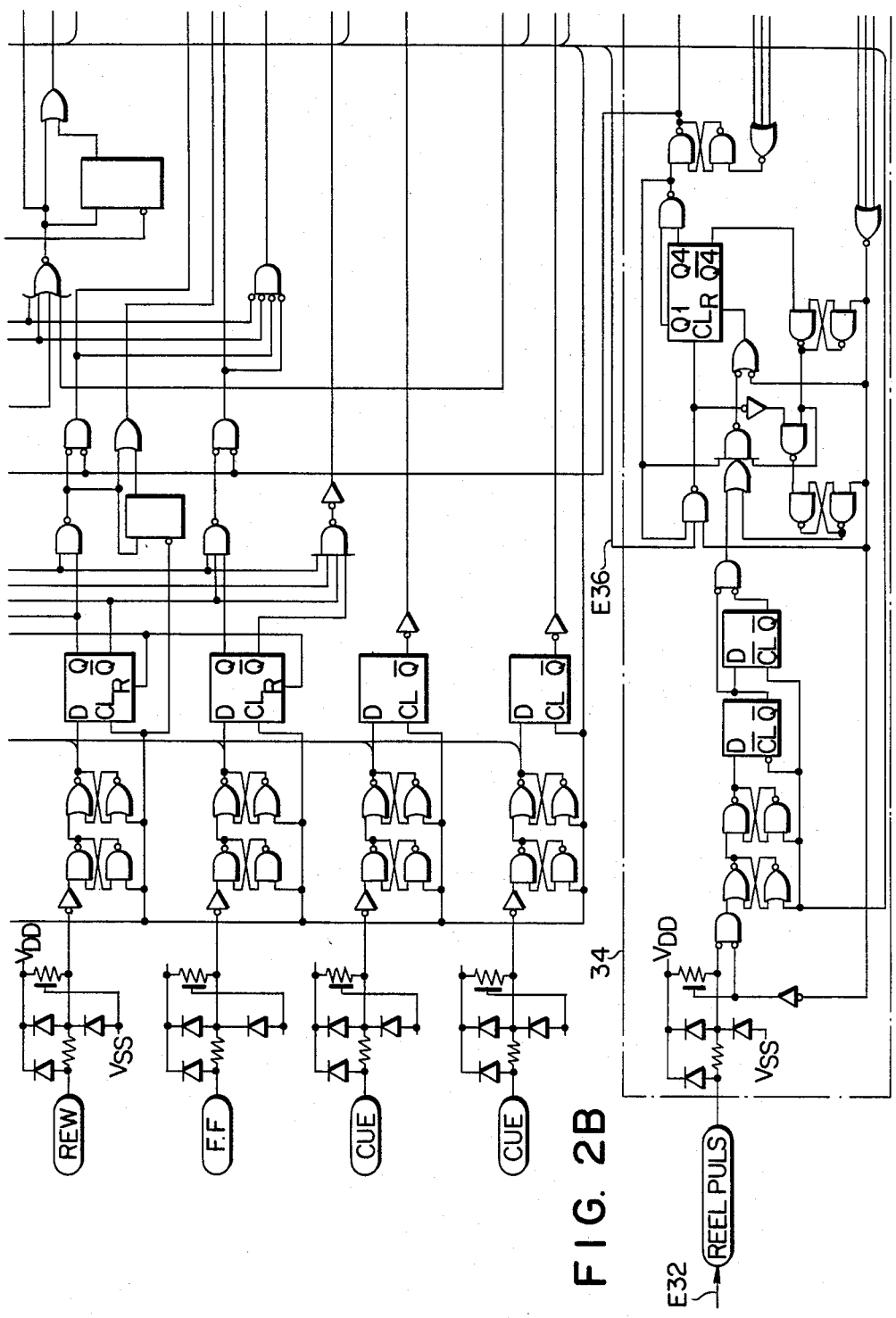
Figure 2C:
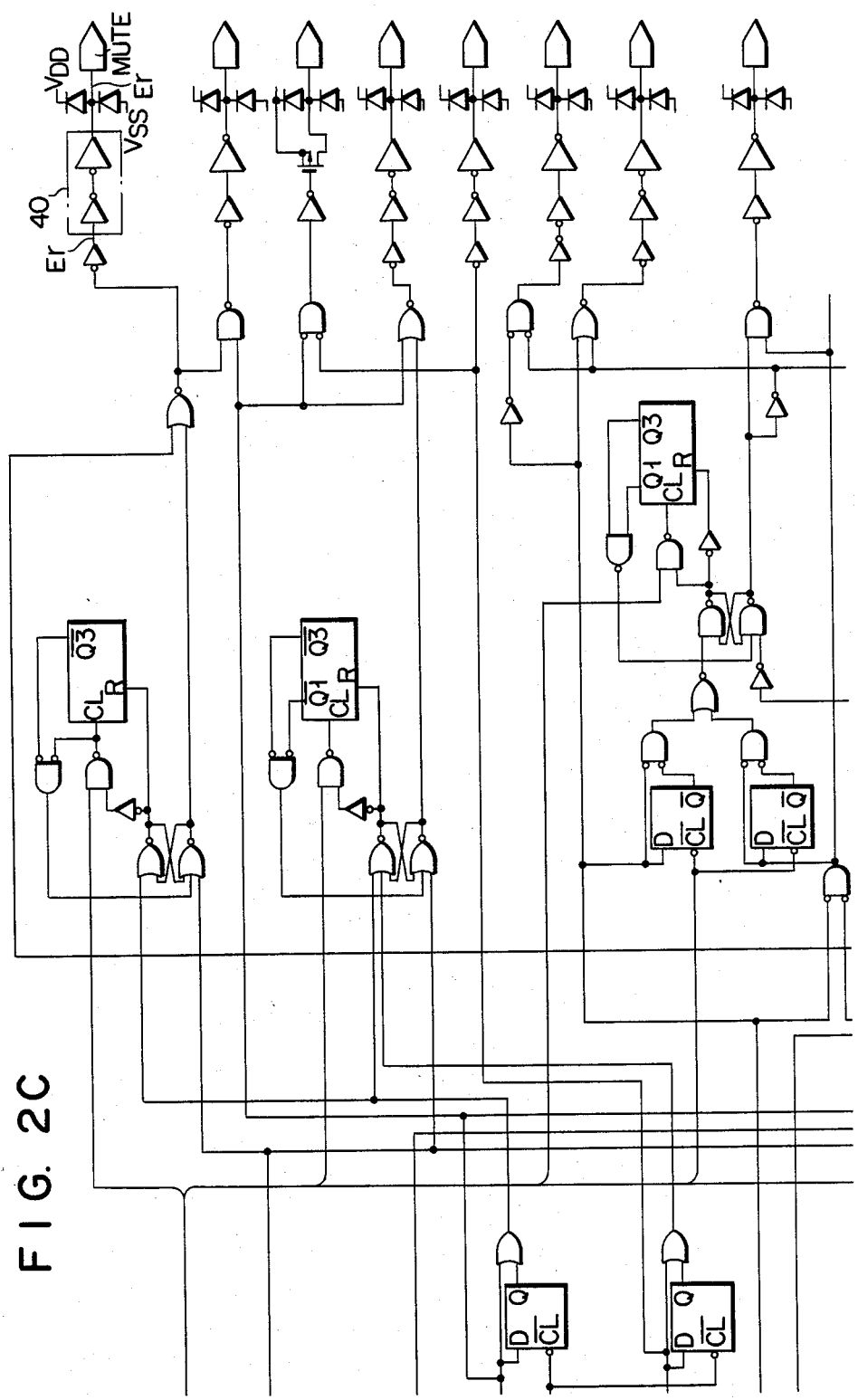
Figure 2D:
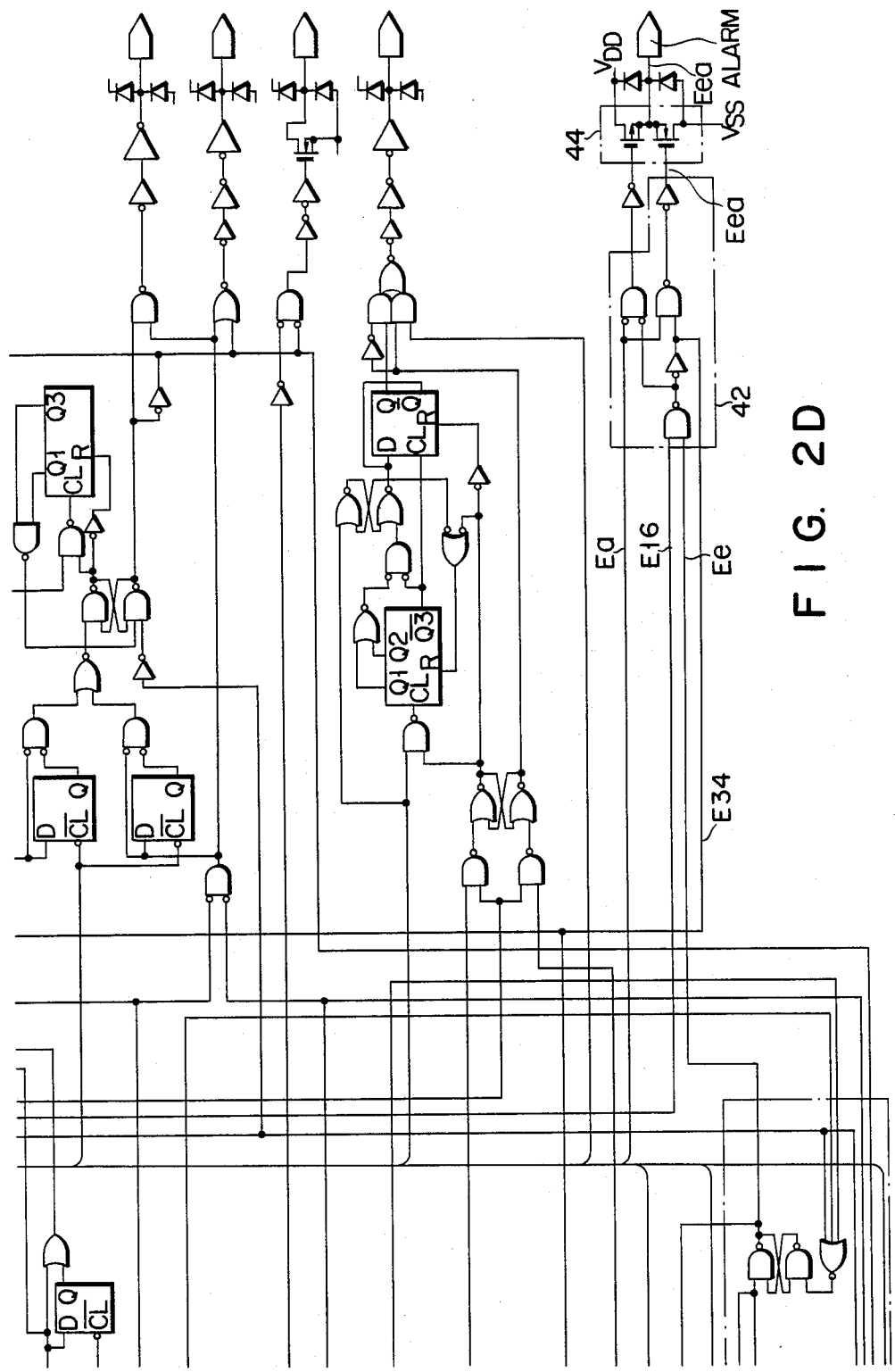

When the tape recorder is set at a recording mode by actuating an operation key 10, then a recording-muting signal Er and recording mode signal E16 are issued from a control circuit 12. The control circuit 12 may be formed of a commercially available type such as the model M 54410 P manufactured by the Mitsubishi Electric Co. or the model HA 12001 W manufactured by the Hitachi Works. The recording-muting signal Er is supplied to a power amplifier 18 through a buffer 40 (FIG. 2). The recording mode signal E16 is conducted to a first input terminal of an AND gate 42, whose second input terminal is supplied with a tape end muting signal Ee. A third input terminal of the AND gate 42 receives an end alarm signal Ea.

The tape end muting signal Ee is issued from a tape end detector 34. The end alarm signal Ea is generated from an oscillator 36. The detector 34 may be formed of, for example, a re-triggerable multivibrator provided with a model NE 555 manufactured by Texas Instruments Inc., U.S.A. This re-triggerable multivibrator is shown as a missing pulse detector in the catalog of Texas Instruments. In the arrangement of FIG. 1, the retriggerable multivibrator is triggered by a pulse signal E32 shown in FIG. 1. Where the time width of the pulse signal E32 exceeds a time width defined by the time constant of said re-triggerable multivibrator, then an output signal having a logic level "0" is produced. When this output signal has its logic level reversed from "0" to "1", then the tape end muting signal Ee results. A tape end signal E34 is sent forth in the same timing as the tape end muting signal Ee. The tape detector 34 may be formed of a counter/comparator which detects the number of the pulse signals E32 with reference to the signal E36 issued from the oscillator 36 or detects the number of the pulse signals E36 with reference to the signal E32. The tape end detector 34 may be obtained from a U.S. Pat. No. 4,331,307 entitled "EARLY TAPE END ALARM FOR A MULTISPEED TAPE RECORDER" invented by K. Furuta (filed on Apr. 4, 1980, U.S. Ser. No. 137,290) or a U.S. Pat. No. 4,367,500 "TAPE END DETECTION APPARATUS" invented by K. Furuta and K. Kanayama (filed on Apr. 21, 1980, U.S. Ser. No. 142,242), both of said applications having been assigned to the assignee of the present invention. The entire disclosures of the above two U.S. applications are incorporated by reference herewith.

A logical AND output signal Eea derived from the AND gate 42 is supplied to a signal mixer 22 and preamplifier 24 through a buffer 44. The logical AND signal Eea is concurrently used as a tape end muting signal and an end alarm signal.

The constituent elements, that is, the circuit 12, detector 34 and oscillator 36 and their peripheral circuits may be formed with the same arrangement as the internal arrangement of a model MSM 5203 GS, a custom-made IC developed by the assignee of the present invention and manufactured by Oki Electric Co. FIGS. 2A to 2D show the circuit arrangement of the model MSM 5203 GS.

Figure 3:
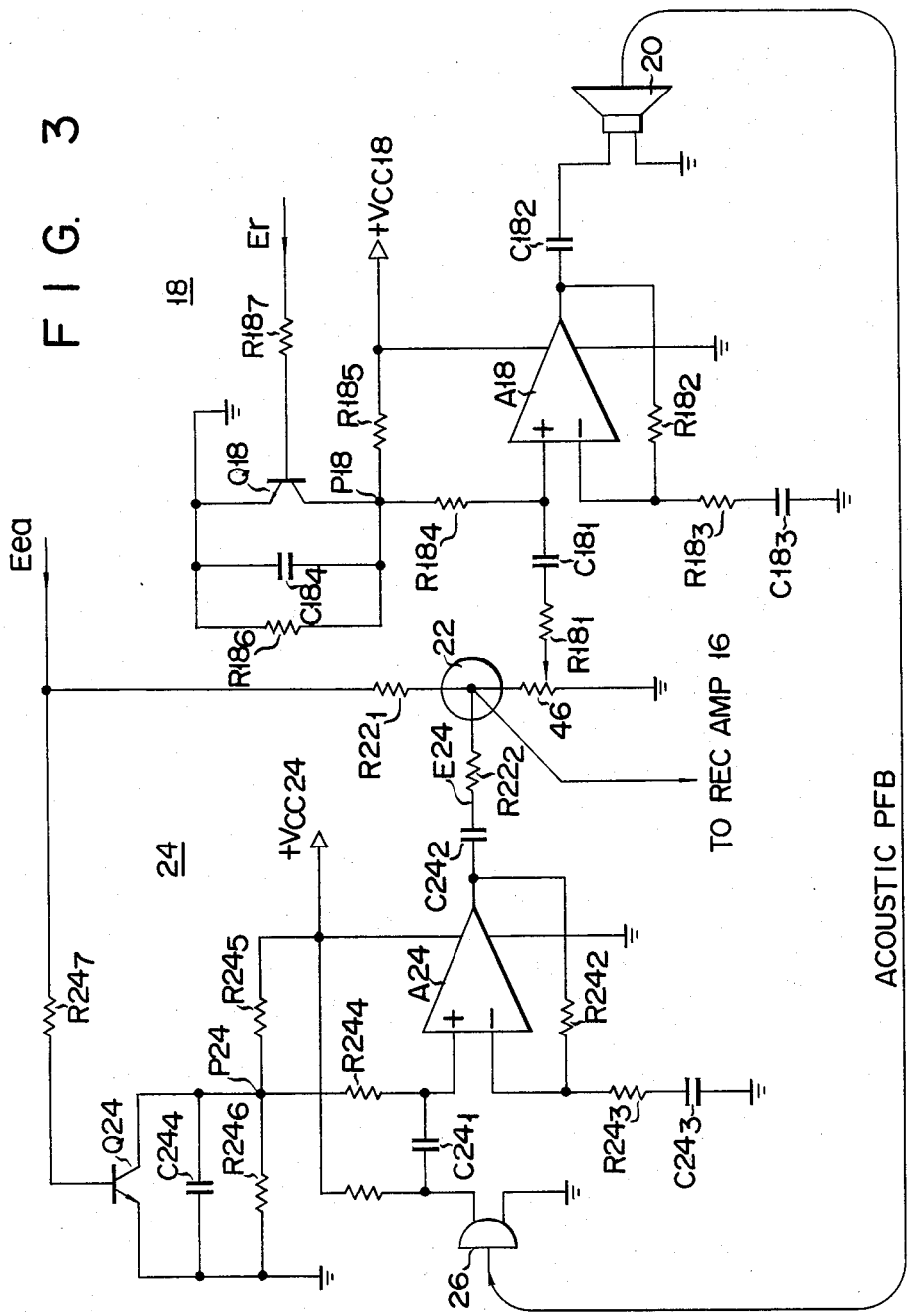
FIG. 3 indicates the arrangement of the audio circuit section of the tape recorder of FIG. 2.

FIG. 3 shows the concrete circuit arrangement of the preamplifier 24, signal mixer 22 and power amplifier 18. The mute/alarm signal Eea is supplied to a volume controller 46 through a resistor $R22_1$. The slider of the volume controller 46 is connected to the noninverted input terminal of a first amplifier A18 through a resistor $R18_1$ and a capacitor $C18_1$. An output terminal of the first amplifier A18 is connected to a speaker 20 through a capacitor $C18_2$, and also to an inverted input terminal thereof through a resistor $R18_2$. The inverted input terminal of the amplifier A18 is grounded through a resistor $R18_3$ and a capacitor $C18_3$. The noninverted input terminal of the amplifier A18 is connected to a positive power source +Vcc18 through resistors $R18_4$ and $R18_5$. The junction P18 of the resistors $R18_4$ and $R18_5$ is grounded through the collector-emitter path of an NPN transistor Q18. A resistor $R18_6$ and a capacitor $C18_4$ are connected in parallel to the collector-emitter path of the transistor Q18, whose base is supplied with the recording muting signal Er through a resistor $R18_7$.

An output signal from an electret condenser microphone 26 is conducted to the noninverted input terminal of a second amplifier A24 through a capacitor $C24_1$. The output terminal of the second amplifier A24 is connected to the volume controller 46 through a capacitor $C24_2$ and a resistor $R22_2$. The output terminal of the amplifier A24 is connected to the inverted input terminal thereof through a resistor $R24_2$. The inverted input terminal of the amplifier is grounded through a resistor $R24_3$ and a capacitor $C24_3$. The noninverted input terminal of the amplifier A24 is connected to a positive power source +Vcc24 through resistors $R24_4$ and $R24_5$. The junction P24 of the resistor $R24_4$ and $R24_5$ is grounded through the collector-emitter path of an NPN transistor Q24. A resistor $R24_6$ and a capacitor $C24_4$ are connected in parallel to the collector-emitter path of the transistor Q24, whose base is supplied with the mute/alarm signal Eea through a resistor $R24_7$.

Figure 4:
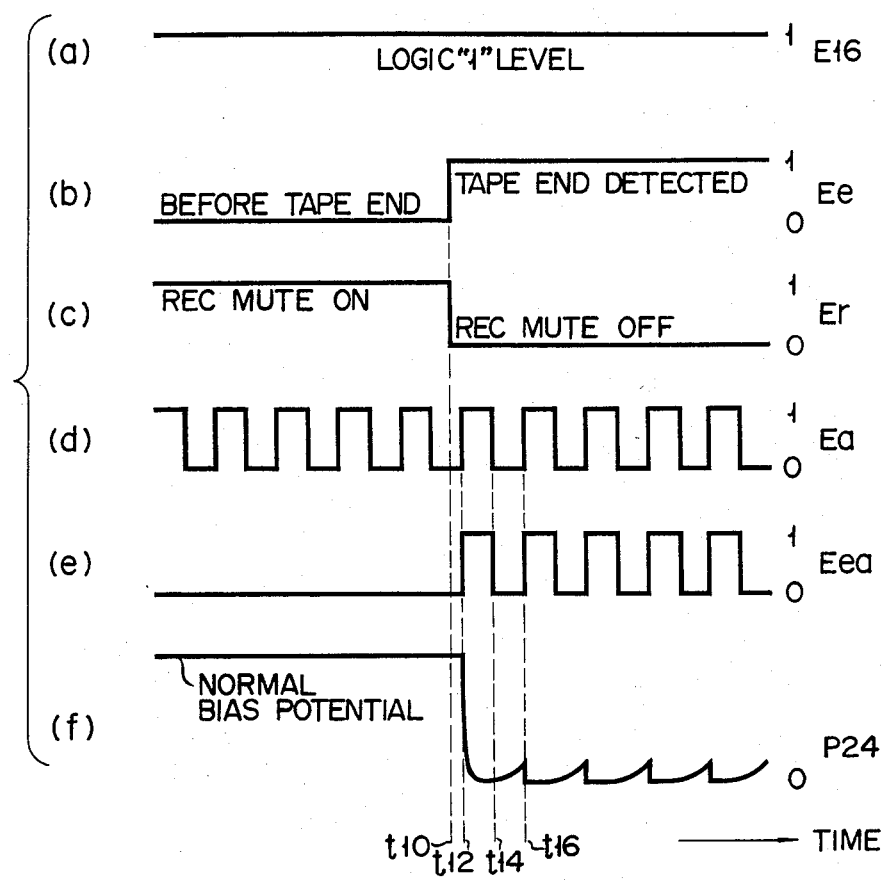
FIGS. 4(a) to 4(f) are timing charts illustrating the operations of the circuit arrangements of FIGS. 2 and 3.

FIGS. 4(a) to 4(f) are timing charts illustrating the operation of the arrangements of FIGS. 2 and 3. FIG. 4(a) shows the case where the control circuit 12 is set at a recording mode (E16=1). Before a point of time t10, Ee=0 results as shown in FIG. 4(b). Therefore, the mute/alarm signal Eea is not produced as seen from FIG. 4(e) (the signal Eea retains a logic level "0"). Consequently, the transistor Q24 of FIG. 3 is rendered nonconducting, causing the bias potential at the junction P24 to retain a given prescribed value (normally about ½ of Vcc24). Therefore, sound picked up by the microphone 26 is amplified by the preamplifier 24 to a sufficient level. The amplified sound is supplied as a voice signal E24 to the recording amplifier 16 and power amplifier 18. Before the point of time t10, Er=1 results as seen from FIG. 4(c), causing the transistor Q18 to be conducting. Therefore, the potential at the junction P18 is substantially reduced to zero. Since, at this time, the power amplifier 18 carries out substantially no amplification, sound picked up by the microphone 26 is not sent forth from the speaker 20, even though the volume controller 46 is not suppressed or throttled. In other words, an acoustic positive feedback loop from the speaker 20 to the microphone 26 is shut off, suppressing the occurrence of howling.

Now let it be assumed that the tape run is brought to an end, and the tape end is detected at the point of time t10. Then Ee=1, and Er=0 result as seen from FIGS. 4(b) and 4(c). Because of E16=1, Ee=1, the AND gate 42 (FIG. 2) is opened. As a result, an alarm signal Ea shown in FIG. 4(d) passes through the gate 42, and at a point of time t12, Eea=1 results as seen from FIG. 4(e). At this time, the transistor Q24 is rendered conducting, and the potential at the junction P24 is substantially reduced to zero as seen from FIG. 4(f). After the point of time t12, the transistor Q24 is rendered conducting or nonconducting in the same timing as the mute/alarm signal Eea. If, in this case, the circuit mainly consisting of the resistors R24$_5$, R24$_6$ and the capacitor C24$_4$ has a sufficiently larger time constant than the period of the mute/alarm signal Eea, then the potential at the junction P24 does not substantially rise during a period from t14 to t16 in which the transistor Q24 is rendered nonconducting. Namely, not only during a period from t12 to t14, but also during a period from t14 to t16, the second amplifier A24 can not be actuated. After the point of time t12, therefore, the preamplifier 24 carries out substantially no amplification.

After the point of time t10, Er=10 results causing the power amplifier 18 to get ready to amplify the muting/alarm signal Eea. Therefore, an alarm corresponding to the mute/alarm signal Eea is sounded from the speaker 20. Since, however, the preamplifier 24 remains inoperative, the positive feedback loop from the speaker 20 to the microphone 26 remains shut off, thereby suppressing the occurrence of howling. In other words, the arrangement of FIG. 2 enables both muting and the sounding of an alarm to be effected by the mute/alarm signal Eea consisting of a mixture of the tape end muting signal Ee and end alarm signal Ea.

FIGS. 1 and 2 show the arrangement of an audio instrument (tape recorder) having an alarm function to indicate a prescribed mode, for example, a tape end-detecting mode. The tape recorder control system 38A constitutes first means for generating a first mute/alarm signal Eea during the above-mentioned prescribed mode. The constituent elements 18, 20 and 22 jointly form third means responsive to the first mute/alarm signal Eea, for sounding an alarm corresponding to the signal Eea. The constituent elements 24 and 26 jointly form second means for providing a feedback loop (acoustic PFB) including the third means. While the third means gives an alarm upon receipt of the first mute/alarm signal Eea, the feedback loop of the second means is shut off, thereby suppressing the occurrence of, for example, howling.

Figure 5:
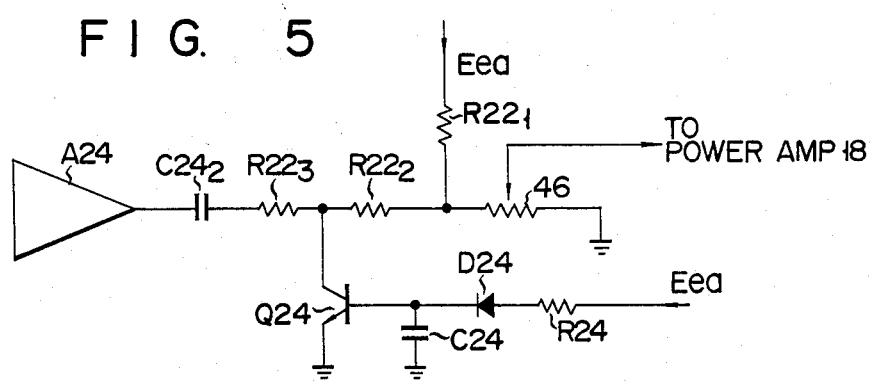
FIGS. 5 and 6 set forth modifications of the circuit arrangement of FIG. 3.

It will be noted that this invention is not limited to the above-mentioned embodiment, but can be practised with various changes and modifications within the scope of the claimed invention. For instance, the term "shutoff of the feedback loop by the third means" does not always imply that said loop is completely cut off. The point is that howling caused by the acoustical coupling of the speaker 20 and the microphone 26 should be prevented. Therefore, it is unnecessary to render the preamplifier 24 completely unactuated. For instance, as shown in FIG. 5, it is possible to provide an attenuator comprising resistors R22$_3$, R22$_2$ and transistor Q24 between the amplifier A24 and the volume controller 46. Where the mute/alarm signal Eea is produced, then the transistor Q24 has its base biased through a resistor R24 and a diode D24, and is rendered conducting. If, at this time, an output signal from the amplifier A24 is attenuated to about one-tenth (−20 dB) of its original level, then howling can be prevented in almost all cases. The transistor Q24 can be kept conducting by the charge stored in the capacitor C24, even during the period (from point of time t14 to point of time t16 shown in FIG. 4(e)) in which the mute/alarm signal Eea has a low level.

Figure 6:
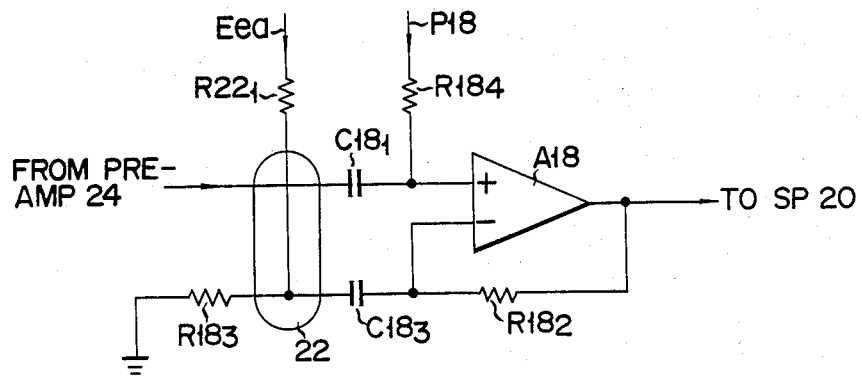

Referring to FIG. 3, the signal Eea is supplied to the noninverted input terminal of the amplifier A18. As indicated in FIG. 6, however, the mute/alarm signal Eea may be applied to the inverted input terminal of the amplifier A18.

Figure 7:
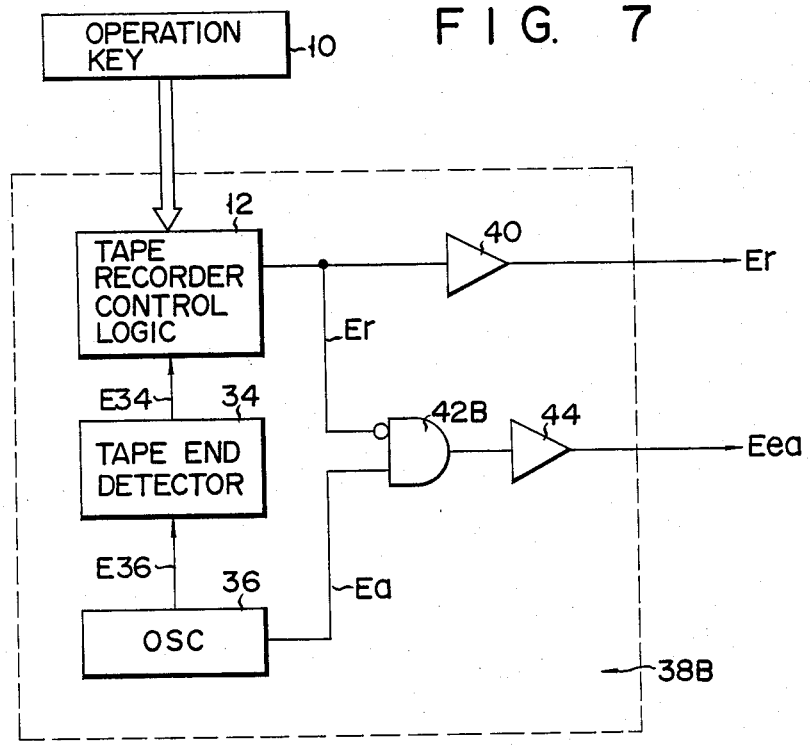
FIG. 7 is a modification of a tape recorder control system shown in FIG. 2.

Further, the signal Eea may not represent a logical AND of E16, Ee and Ea. Depending on the specification of a circuit design, the mute/alarm signal Eea may be formed of a logical AND of the opposite phase signal $\overline{\text{Er}}$ of Er and Ea, as shown in FIG. 7. Namely, when the recording-muting signal Er is supplied to the inverted input terminal of the AND gate 42B, then it is possible to close the gate 42B before the point of time t10 shown in FIG. 4(c) and open the gate 42B after the point of time t10.

What is claimed is:

1. An electronic apparatus having an alarm function for indicating a prescribed mode, comprising:
   first means arranged to detect said prescribed mode, for supplying a first signal indicative of said prescribed mode on a single signal line, said first signal having a given potential before the detection of said prescribed mode and wherein said first signal includes an AC component after the detection of said prescribed mode;
   second means responsive to said first signal, for generating a second signal when said first signal is at said given potential wherein said second signal is generated in the absence of said prescribed mode;
   third means coupled to said single signal line, for generating an alarm sound corresponding to the AC component of said first signal when said first signal includes said AC component, said third means being arranged in acoustic feedback loop relation with respect to said second means wherein howling is produced when an output from said third means is processed by said second means; and
   said second means including fourth means coupled to said single signal line, for causing said acoustic feedback loop to be cut off when said first signal on said signal line includes said AC component, so that the howling otherwise caused by the formation of said acoustic feedback loop is suppressed, said fourth means including:
   resistor means arranged to be coupled to a power supply, for generating a bias potential from the potential of said power supply;
   capacitor means coupled to said resistor means, to provide a time constant sufficiently large to retard a rapid increase of said bias potential during a period of repetition of said AC component; and switch means coupled to said capacitor means and responsive to said first signal, for decreasing said bias potential relatively rapidly upon receipt of the AC component of said first signal; and said second means further including amplifier means responsive to said bias potential from said resistor means, for generating said second signal, said amplifier means being disabled from generating said second signal when said switch means receives said AC component and said bias potential is fixed under a certain decreased value.

2. An apparatus according to claim 1, wherein said resistor means includes a voltage divider formed of resistors and terminal means, for dividing the voltage potential of said power supply to generate said bias potential, wherein said capacitor means includes a capacitor coupled to the terminal means of said voltage divider, for developing with the resistors of said voltage divider a time constant which corresponds to the product of the resistance at the terminal means of said voltage divider and the capacitance of said capacitor, said time constant being selected to be larger than the value corresponding to the period of said AC component, and wherein said switch means includes a transistor having a collector-emitter path coupled to said capacitor and a base responsive to the potential of said first signal, for short-circuiting said capacitor through said collector-emitter path to provide said bias potential which is less than said certain decreased value.

3. An apparatus according to claim 2, wherein said second means includes a first amplifier forming said amplifier means and a microphone for providing a microphone output, said first amplifier being operative to amplify said microphone output to produce said second signal when said bias potential is at a predetermined value, and to cease production of said second signal when said bias potential is fixed under said certain decreased value, and wherein said third means includes a speaker and a second amplifier for driving said speaker according to one of said second signal and the AC component of said first signal, said second amplifier driving said speaker so that the alarm sound is generated when said first signal includes said AC component, the sound output from said speaker being acoustically coupled to said microphone to form said feedback loop wherein said feedback loop is cut-off when said first amplifier ceases to produce said second signal in response to operation of said switch means.

4. An apparatus according to claim 3, including:

a tape recorder transport, and wherein said first means includes:

- a tape end detector coupled to said tape recorder transport, for detecting an end of run of tape in said transport to generate a tape end signal;

an oscillator for generating an alarm signal corresponding to the AC component of said first signal; and a gate circuit coupled to said tape end detector and said oscillator, for generating said first signal at an output of said gate circuit from said alarm signal at an input of said gate circuit when said tape end signal is generated.

5. An apparatus according to claim 3, including:

a tape recorder transport, and wherein said second amplifier includes a recording mute circuit for suppressing the generation of sound from said speaker in response to a recording mute signal;

wherein said first means includes:

a control circuit coupled to said tape recorder transport and said second amplifier for supplying said recording mute signal to said recording mute circuit to designate a recording mode for the tape recorder transport in which mode said speaker generates no sound when the recording mode is designated; and a gate circuit coupled to said control circuit and said oscillator, for generating said first signal at an output of said gate circuit from said alarm signal at an input of said gate circuit in the absence of said recording mute signal.

6. An apparatus according to any one of claims 1, 2, 3, 4 or 5, wherein said first means is circuit-integrated in an IC package including external connection pins, one of said external connection pins being arranged to provide said first signal.

* * * * *